United States Patent
Ebizuka et al.

(10) Patent No.: US 9,105,446 B2
(45) Date of Patent: Aug. 11, 2015

(54) CHARGED PARTICLE BEAM APPARATUS

(71) Applicant: Hitachi High-Technologies Corporation, Minato-ku, Tokyo (JP)

(72) Inventors: Yasushi Ebizuka, Tokyo (JP); Seiichiro Kanno, Tokyo (JP); Makoto Nishihara, Tokyo (JP); Masashi Fujita, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/376,901

(22) PCT Filed: Jan. 28, 2013

(86) PCT No.: PCT/JP2013/051693
§ 371 (c)(1),
(2) Date: Aug. 6, 2014

(87) PCT Pub. No.: WO2013/118594
PCT Pub. Date: Aug. 15, 2013

(65) Prior Publication Data
US 2015/0097123 A1    Apr. 9, 2015

(30) Foreign Application Priority Data

Feb. 9, 2012  (JP) ................. 2012-025676

(51) Int. Cl.
| | |
|---|---|
| *H01J 37/30* | (2006.01) |
| *H01J 37/22* | (2006.01) |
| *H02N 13/00* | (2006.01) |
| *H01J 37/28* | (2006.01) |
| *H01J 37/20* | (2006.01) |

(52) U.S. Cl.
CPC ............. *H01J 37/226* (2013.01); *H01J 37/20* (2013.01); *H01J 37/28* (2013.01); *H02N 13/00* (2013.01); *H01J 2237/06* (2013.01); *H01J 2237/2007* (2013.01); *H01J 2237/2801* (2013.01)

(58) Field of Classification Search
CPC ............. G03F 7/7085; H01J 2237/022; H01J 2237/151; H01J 37/12; B08B 7/00; B08B 7/0035; B08B 7/04
USPC ......... 250/492.2, 442.11, 310, 306, 251, 398; 134/1; 356/51
See application file for complete search history.

(56) References Cited

U.S. PATENT DOCUMENTS

| | | | |
|---|---|---|---|
| 6,507,029 B1 * | 1/2003 | Nishimura et al. | 250/442.11 |
| 2003/0066975 A1 * | 4/2003 | Okada | 250/492.2 |
| 2005/0190310 A1 * | 9/2005 | Koyama et al. | 349/5 |
| 2006/0289755 A1 * | 12/2006 | Koyama et al. | 250/310 |

FOREIGN PATENT DOCUMENTS

| | | |
|---|---|---|
| JP | 02-117131 A | 5/1990 |
| JP | 10-027566 A | 1/1998 |
| JP | 11-354621 A1 | 12/1999 |

* cited by examiner

*Primary Examiner* — Nikita Wells
(74) *Attorney, Agent, or Firm* — Miles & Stockbridge P.C.

(57) ABSTRACT

An object of the present invention is to provide a charged particle beam apparatus that effectively removes electrical charges from an electrostatic chuck.
In order to achieve the above object, the charged particle beam apparatus of the present invention includes a sample chamber that maintains a space containing an electrostatic chuck mechanism (5) in a vacuum state; and in which the charged particle beam apparatus includes an ultraviolet light source (6) to irradiate ultraviolet light within the sample chamber, and a irradiation target member irradiated by the ultraviolet light; and the irradiation target member is placed perpendicular to the adsorption surface of the electrostatic chuck.

5 Claims, 16 Drawing Sheets

CHARGED PARTICLE BEAM APPARATUS

TECHNICAL FIELD

The present invention relates to a charged particle beam apparatus that measures line width, performs fault inspections, and acquires images in semiconductor devices by utilizing an electron beam, and relates in particular to a charged particle beam apparatus that effectively removes residual electrical charges for example in the sample stage placed within a vacuum chamber.

BACKGROUND ART

In recent years, electron microscopes which are one type of charged particle beam apparatus are being applied to measurement of semiconductor device patterns and fault inspections. A Critical-Dimension Scanning Electron Microscope (hereafter CD-SEM) for example is utilized to measure the gate dimensions of semiconductor devices and a fault inspection SEM is utilized in fault inspections. Moreover, a scanning electron microscope is utilized for conductance inspections in deep hole for wiring by utilizing the contrast in voltage potential.

In the patent literature 1 on the other hand, an ion beam machining device is disclosed that suppresses electrical charges by irradiating ultraviolet light from an ultraviolet light source mounted in a vacuum chamber in order to remove electrical charges in a sample within a device containing a vacuum chamber the same as an electron microscope.

CITATION LIST

Patent Literature

Patent literature 1: Japanese Unexamined Patent Application Publication No. Hei2 (1990)-117131

SUMMARY OF INVENTION

Technical Problem

In devices to irradiate a charged particle beam within a vacuum chamber such as electron microscopes or ion beam devices, a sample stage is mounted to hold the sample serving as the object for irradiation by a charged particle beam. The charged particle beam apparatus irradiates a charged particle beam on a desired location by appropriately controlling the position of this sample stage. There are a variety of sample stage types and among these types is a sample stage containing an electrostatic chuck mechanism that holds the sample by utilizing Coulomb force. The electrostatic chuck mechanism is capable of clamping a sample that is for example a semiconductor wafer while also flattening curvatures since the entire surface of the wafer is held by a largely uniform force. The sample holding surface of the electrostatic chuck on the other hand is covered by a material such as ceramic having high insulation properties and so has the feature that electrical charges are prone to easily occur. This type of electrical charge (residual electrical charge) might possibly for example cause changes in the focus conditions of the electron beam or generate a residual adsorption force when withdrawing the wafer so that these charges are preferably removed.

The patent literature 1 discloses nothing about utilizing ultraviolet light to remove electrical charges from electrostatic chucks, and a study by the present inventors clearly shows that to the contrary, irradiating ultraviolet light onto the electrostatic chuck might attract electrical charges.

Hereafter, a charged particle beam apparatus for the object of obtaining a high electrical charge removal effect on electrostatic chucks is described.

Solution to Problem

In order to achieve the above described object, one aspect of the present invention proposes a charged particle beam apparatus including a charged particle source, an electrostatic chuck mechanism that holds the sample to be irradiated by the charged particle beam, and a sample chamber that maintains a space containing the electrostatic chuck mechanism in a vacuum state; and in which the charged particle beam apparatus further includes an ultraviolet light source to irradiate ultraviolet light within the sample chamber, and an irradiation target member that is irradiated by the ultraviolet light, and the irradiation target member is placed perpendicular to the adsorption surface of the electrostatic chuck.

Advantageous Effects of Invention

The above described structure is capable of generating ionized residual gas by way of the irradiation target member and the residual gas has an electrical charge removal effect so that electrical charges can be removed from the electrostatic chuck without directly irradiating ultraviolet light onto the electrostatic chuck.

DESCRIPTION OF EMBODIMENTS

Figure 1:
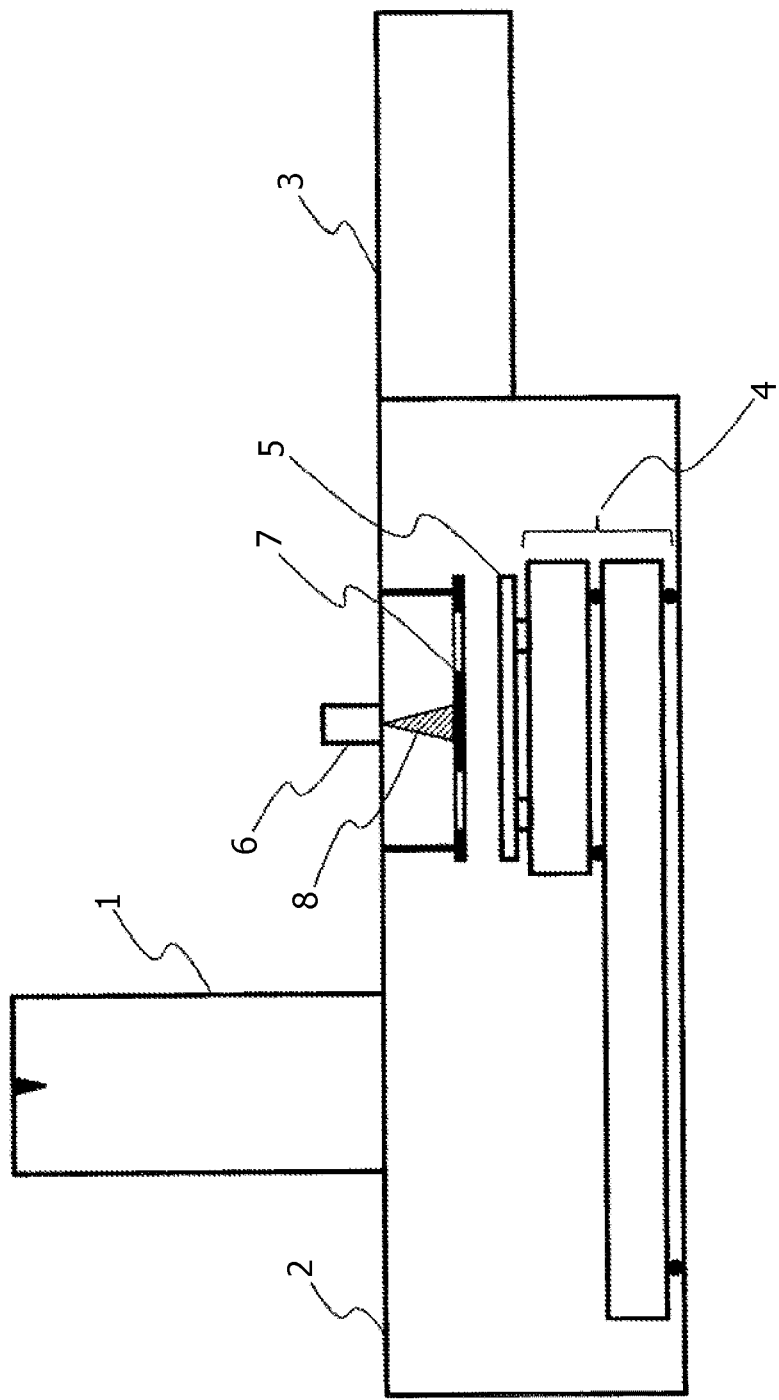
FIG. 1 is a drawing showing an example of a scanning electron microscope including an anti-static mechanism containing an ultraviolet light source.

Hereafter a CD-SEM is utilized as one example of a charged particle beam apparatus to provide a simple description of the basic principle of CD-SEM measurement. The CD-SEM is fundamentally the same as an electron scanning microscope. An electron gun emits primary electrons and applies a voltage, accelerating the electrons. An electromagnetic lens subsequently narrows the beam diameter of the electron beam. This electron beam scans two-dimensionally over the sample such as a semiconductor wafer. A detector detects the secondary electrons emitted from the scanned sample irradiated by the electron beam. The intensity of these secondary electrons is reflected in the shape of the sample surface so that a tiny pattern over the sample can be imaged by synchronizing the electron beam scanning and the detection of secondary electrons for display on a monitor. When for example measuring the line width of the gate electrode, the CD-SEM identifies the edge of the pattern based on the light and dark shades of the acquired image and extracts the dimensions. The description of the CD-SEM measurement principle is now complete.

The CD-SEM is utilized in measuring dimensions of device patterns on semiconductor production lines and therefore the throughput is extremely important as well as performance as an electron microscope in terms of resolution and measurement length repeatability. There are multiple factors that determine the throughput but the factors exerting a particularly large effect are the movement speed of the stage carrying the wafer and the time required for autofocus when acquiring images. One effective method for improving this second item is said to be electrostatic chucking of the stage. In other words, if the wafer could be stably clamped to the electrostatic chuck, the wafer could be transported at a high acceleration and high speed without falling from the stage. Moreover, utilizing the electrostatic chuck would allow flat clamping of curved wafer at a nearly equivalent force across the entire surface of the wafer so that the time required for setting the value of current flowing to the coil of the objective lens in order to make a uniform height distribution within the wafer surface and align the focus or namely the time for autofocusing could be shortened.

Applying an electrostatic chuck to an electron microscope in this way can be expected to provide various improved effects on performance however there are also problems inherent in those features. For example, the surface of the electrostatic chuck for holding the wafer is covered by ceramic material having high electrical insulation so that the contact and friction between the wafer and electrostatic chuck generates electrical charges that cause residual electrical charges on the electrostatic chuck. These accumulated residual electrical charges not only cause poor focusing of the acquired image, but also generate a residual adsorption force caused by the residual electrical charges that might lower the throughput and cause conveying errors.

The static electrical force also pulls in foreign matter from the periphery that might cause the foreign matter to adhere over the wafer. Even though the electrical charges generated by this contact and friction can be suppressed by reducing the attraction force of the wafer and the friction, these cannot be completely eliminated. Therefore, the residual electrical charges accumulated on the electrostatic chuck must be periodically removed in order to achieve stable operation of an electron microscope utilizing an electrostatic chuck.

The following three methods are cited for as methods for eliminating residual electrical charges (hereafter, called removing electrical charges). A first method is a method for cleaning the surface of the electrostatic chuck with a cloth soaked in organic solvent such as alcohol. This technique is capable of removing residual electrical charges by way of solvent coated over the electrostatic chuck. However, the cleaning requires opening the vacuum chamber where the electrostatic chuck is mounted to the outside atmosphere and a great amount of time is required from opening up to atmospheric pressure until raising a vacuum. A second method generates a plasma within the vacuum container where the electrostatic chuck is mounted and neutralizes the electrical charges by dissociation of the residual gas. This technique is capable of removing electrical charges without opening the vacuum container up to the outside atmosphere; however, many high energy charged particles are emitted that might damage the internal components within the device. Finally, a third method emits ultraviolet rays into the vacuum container to neutralize the electrical charges by dissociated residual gas ions and electrons that remove the electrical charges. This technique is capable of removing electrical charges while still maintaining a vacuum in the device and the generated ions and the electron energy are extremely low so that no damage is imparted to the internal components of the device.

Figure 2:
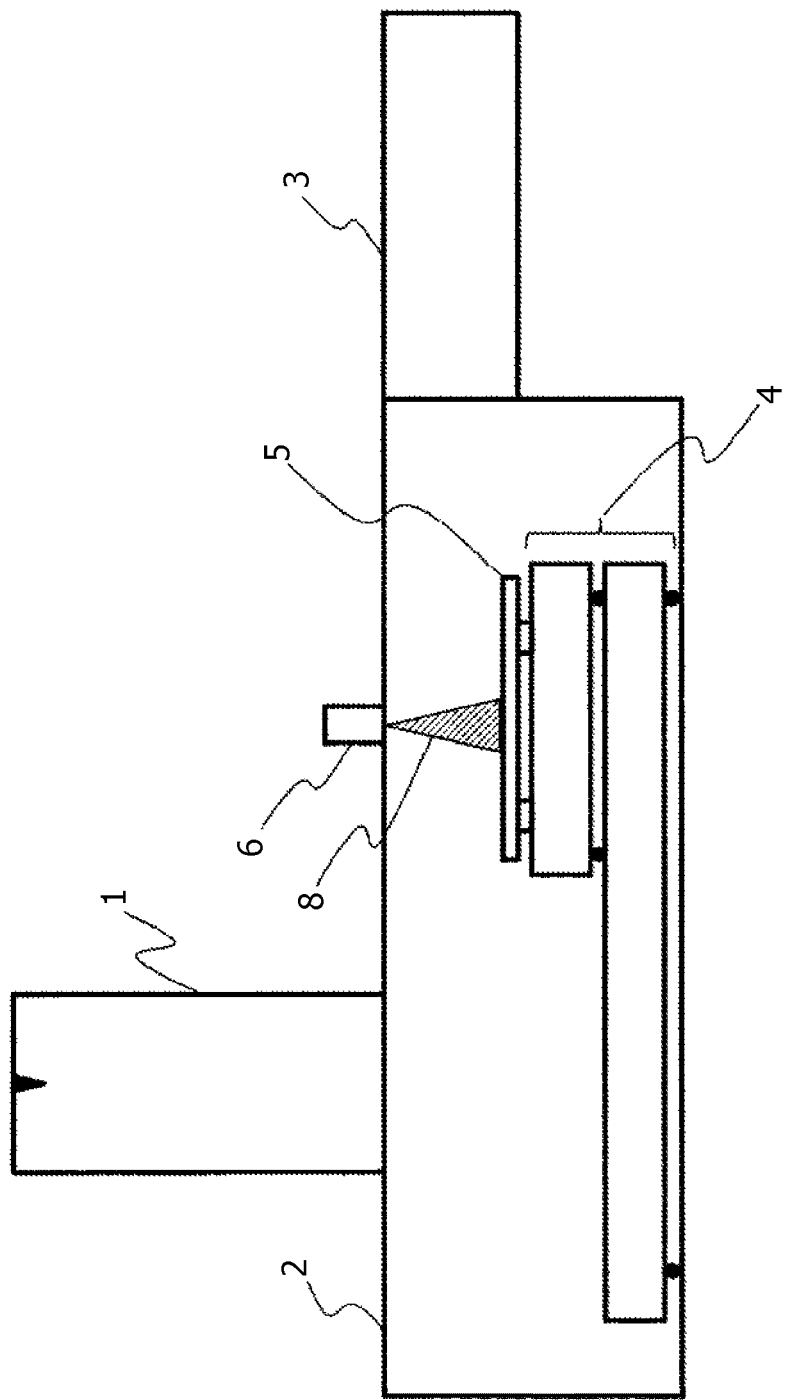
FIG. 2 is a drawing showing an example of a scanning electron microscope including an anti-static mechanism for directly irradiating ultraviolet light on an electrostatic chuck from the ultraviolet light source.

However, when removing electrical charges by ultraviolet rays, some equipment is easily susceptible to effects from residual electrical charges such as in the CD-SEM so that the photoelectric effect rendered by irradiation from ultraviolet rays cannot be ignored. FIG. 2 shows an example where electrical charge removal function by ultraviolet rays is utilized in a CD-SEM. A lens tube 1 containing an electron gun to emit an electron beam is coupled to a sample chamber 2. The sample chamber 2 includes a pre-exhaust chamber 3 for wafer replacement. The lens tube 1 and sample chamber 2 are constantly maintained at a high vacuum, the pre-exhaust chamber 3 is opened to the outside atmosphere during sample replacement, and constantly maintained at a high vacuum during wafer observation. An electrostatic chuck 5 is clamped over the X-Y stage 4 mounted within the sample chamber 2; a wafer not shown in the drawing is clamped over the electrostatic chuck 5 when observing wafers and the X-Y stage 4 operating along with the electrostatic chuck 5 is moved to an optional position over the wafer for observation.

An ultraviolet light source 6 for removing the residual electrical charges accumulated on the surface of the electrostatic chuck 5 is mounted in the sample chamber 2. The ultraviolet rays emitted from the ultraviolet light source 6 are conveyed within the ultraviolet ray emission region 8. The residual gas is dissociated by the ultraviolet ray irradiation within the ultraviolet ray emission region 8, and the generated residual gas ions and electrons reach to above the electrostatic chuck and neutralize the residual electrical charges.

Figure 3:
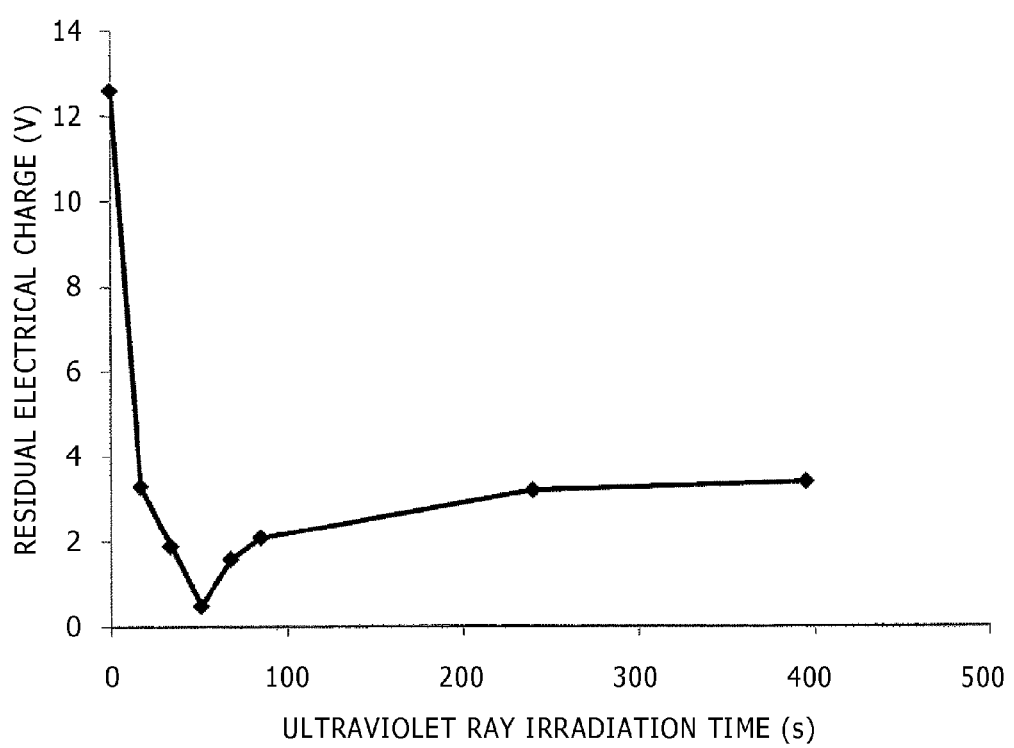
FIG. 3 is a drawing showing the electrical charge removal effect when ultraviolet light is directly irradiated on an electrostatic chuck from the ultraviolet light source.

FIG. 3 shows an example of results from measuring the time required for electrical charge removal when irradiation of ultraviolet rays is utilized to remove electrical charges on an electrostatic chuck in this type of structure. The irradiation of ultraviolet rays swiftly removes the residual electrical charges but continued ultraviolet ray irradiation forms positive electrical charges. This result occurs because light containing energy larger than the work function of the electrostatic chuck material evokes a photoelectric effect over the electrostatic chuck so that the electrostatic chuck that has emitted the electrons become positive electrical charges. These positive electrical charges are weakened by joining with electrons irradiated by the ultraviolet rays so that even though saturated to a specific level, the residual electrical charges cannot be completely removed in a structure where ultraviolet rays are directly irradiated to the electrostatic chuck.

Figure 4:
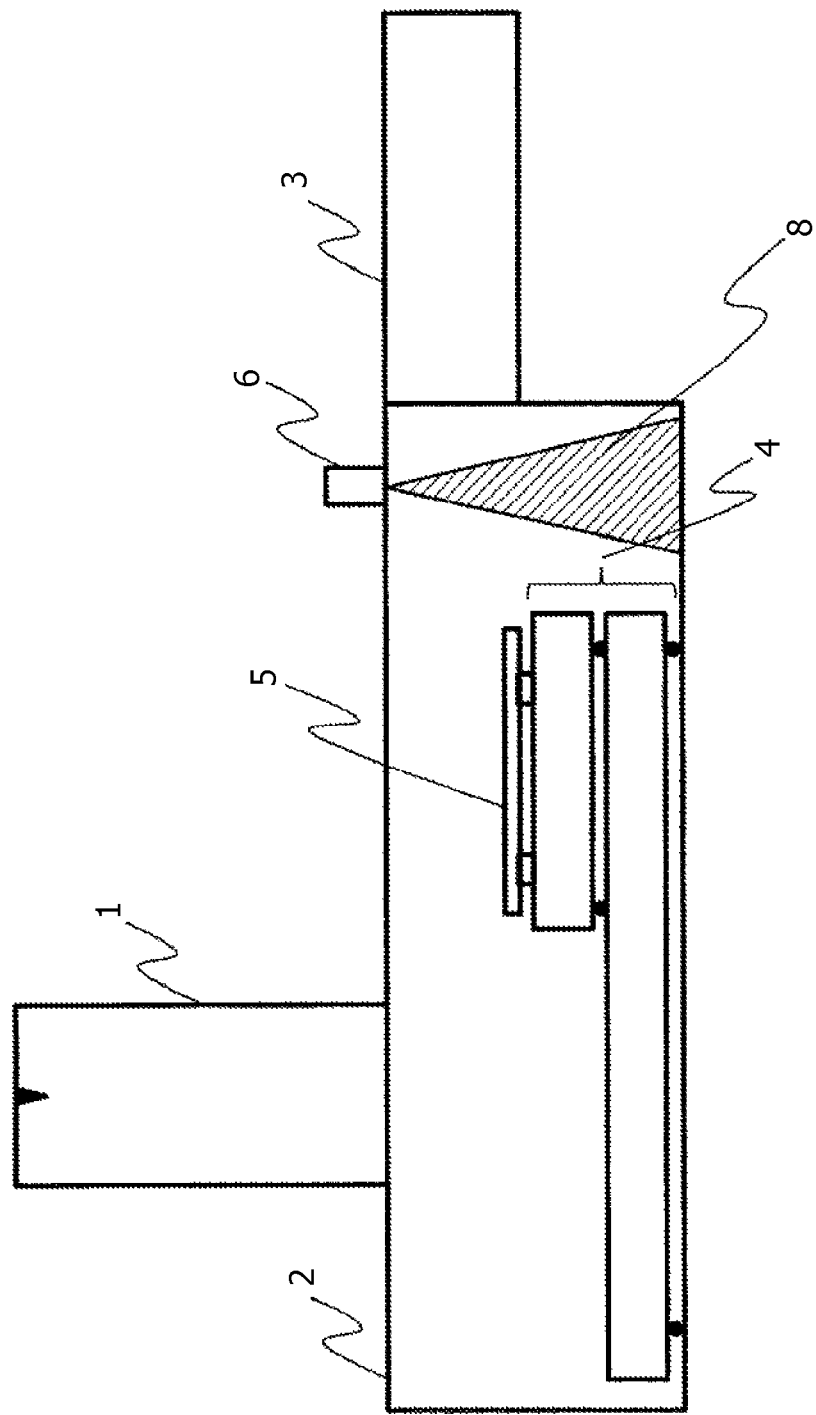
FIG. 4 is a drawing showing an example of a scanning electron microscope including an anti-static mechanism for irradiating ultraviolet light on a position different from that of the electrostatic chuck.

An arrangement that does not allow direct irradiation of the ultraviolet rays to the electrostatic chuck is required so that positive electrical charges are not emitted due to the photoelectric effect over the electrostatic chuck. One method for example installs the ultraviolet light source 6 offset in a horizontal direction as shown in FIG. 4.

In this type of arrangement, the ultraviolet ray emission region 8 does not overlap the electrostatic chuck so that there is no direct irradiation to the electrostatic chuck. However, when the ultraviolet light source 6 is placed in this type of position, the symmetry between the ultraviolet ray light axis and the electrostatic chuck for removing electrical charges deteriorates so that the process of removing electrical charges is spatially non-uniform.

Figure 5:
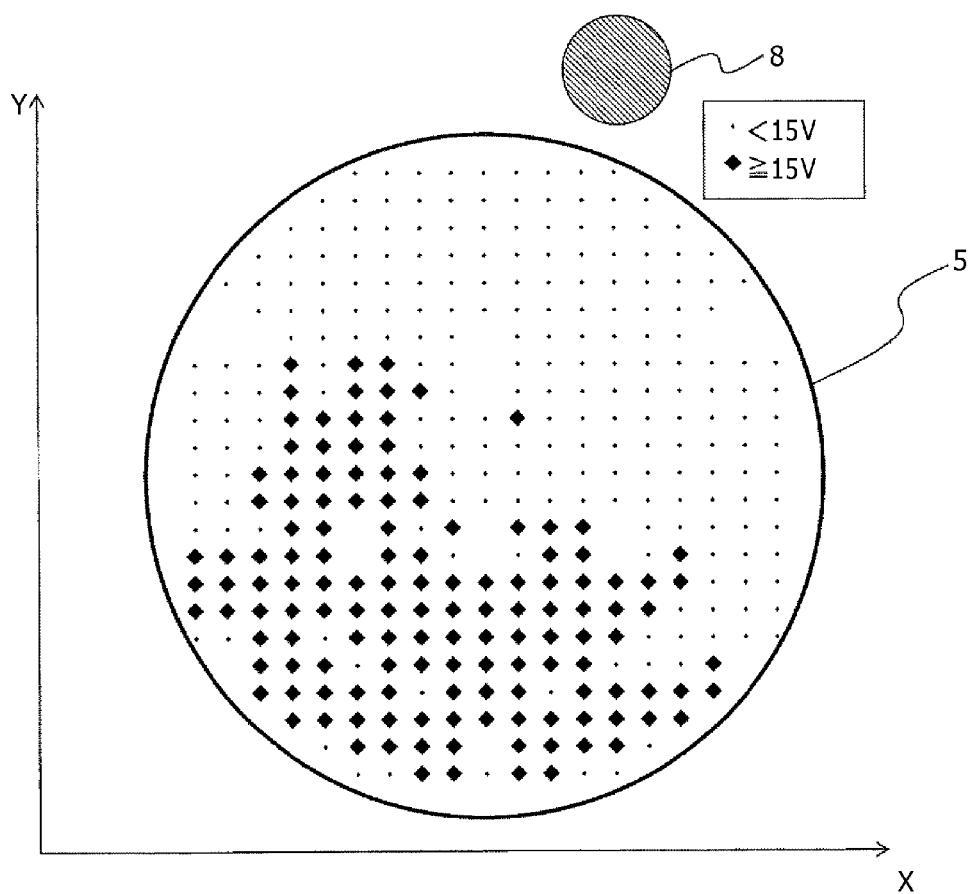
FIG. 5 is a drawing showing the electrical charge distribution on the electrostatic chuck when ultraviolet light is irradiated from the ultraviolet light source.

FIG. 5 shows an example of results from measuring the electrical charge distribution on the electrostatic chuck after removing electrical charges with the placement from this type of arrangement. The removal of electrical charges from the vicinity of the ultraviolet light source 6 is complete but electrical charges remain in regions away from the ultraviolet light source 6. If the region occupied by these local residual electrical charges is small the average residual electrical charge over the entire electrostatic chuck is small so that there is no problem during observation. However, when a shift must be successively made to the next measurement position in a short time as possible, the swing width for autofocus made at each measurement position must be enlarged and causes a drop in throughput in the device. Moreover, the more accumulation of this local residual electrical charges increases, the more time needed for removing electrical charges is required.

Figure 6:
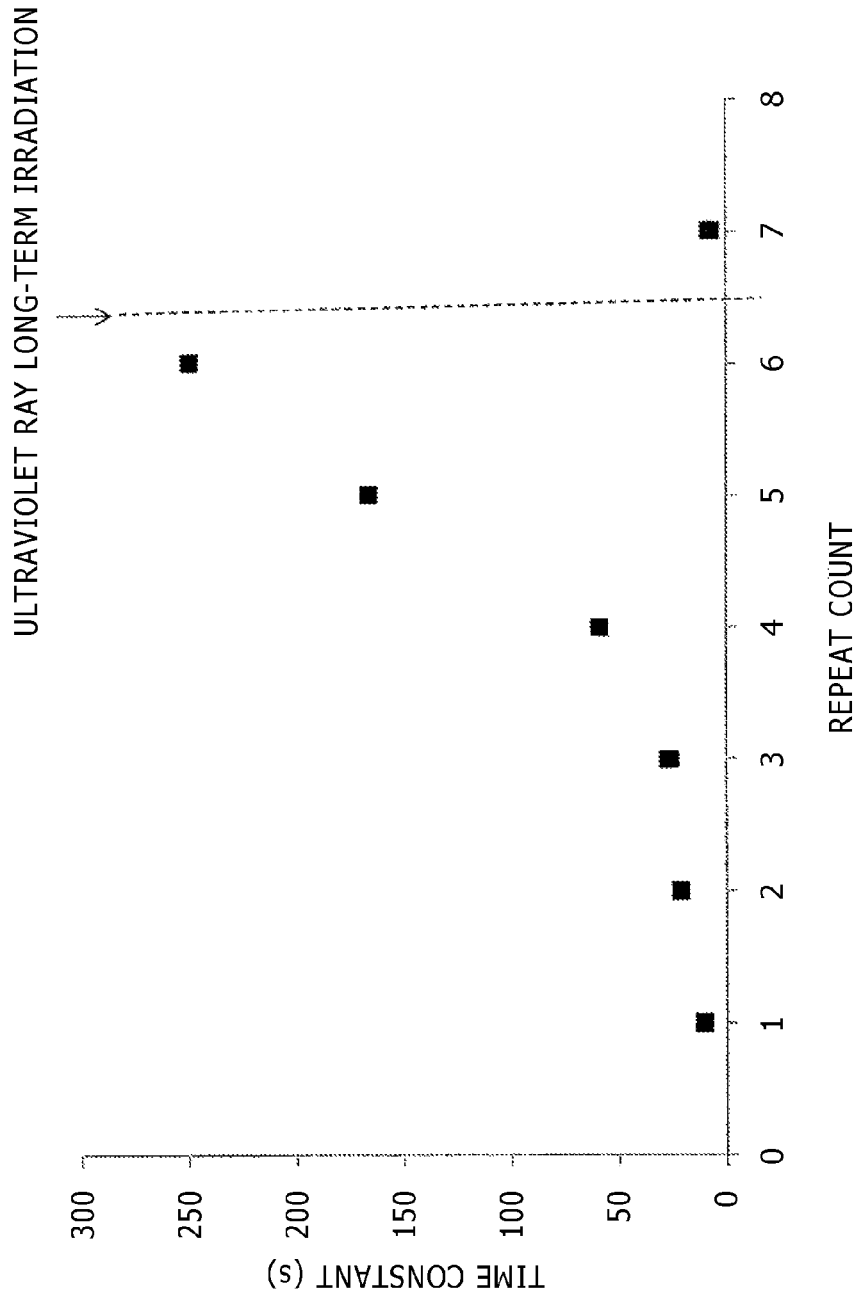
FIG. 6 is a graph showing the relation between the time required for electrical charge removal, and the repeat count when ultraviolet light is irradiated from the ultraviolet light source.

FIG. 6 shows an example from repeated measurement of charge removal time when utilizing this type of structure. The local residual electrical charges can be observed to accumulate at each subsequent count so that the time constant for electrical charge removal increases. If ultraviolet light is irradiated for a long time, the electrical charges are also removed in sections located away from the ultraviolet light source 6 so the time constant for electrical charge removal returns to the original value. However, this type of long term irradiation also results in a long down-time for the device.

In the description in the following example of a scanning electron microscope that grips the wafers in an electrostatic chuck, and utilizes an electron beam to measure, analyze or acquire images of the device over the wafer, and in which the optical axis from the ultraviolet light source to remove residual electrical charges accumulated on the electrostatic chuck is placed concentrically along the same center of the electrostatic chuck, a shielding plate is mounted so that the ultraviolet rays irradiated from the ultraviolet light source do not reach the electrostatic chuck, and further an aperture is formed in the shielding plate only the residual gas ions and electrons generated by irradiation of ultraviolet rays can efficiently reach over the electrostatic chuck More specifically, a scanning electron microscope containing a sample chamber exhausted to a vacuum is described. A scanning electron microscope contains in the sample chamber: a sample stage including an electrostatic chuck to hold the sample, an ultraviolet light source, and an irradiation target member by ultraviolet light emitted from the ultraviolet light source and formed in a position along the adsorption surface of the electrostatic chuck.

Also described is a scanning electron microscope that allows the passage of ultraviolet rays irradiated from the side direction of the electrostatic chuck uniformly in the space over the electrostatic chuck, and moreover having a shielding plate formed so that the ultraviolet rays do not irradiate directly on the electrostatic chuck.

The embodiment described below is capable of thoroughly and uniformly removing residual electrical charges accumulated on the electrostatic chuck in a short time.

An overall view of the CD-SEM utilized in the first embodiment is first of all shown in FIG. 1. An electrostatic chuck 5 is clamped over the X-Y stage 4 within the sample chamber 2 maintained at a high vacuum of $10^{-4}$ to $10^{-5}$ Pa, and a wafer not shown in the drawing is held over the electrostatic chuck 5. Electrostatic chucks are broadly grouped into two methods including electrostatic chucks of the so-called Johnsen-Rahbek type whose characteristic resistance in the dielectric film is from approximately $1 \times 10^9$ Ωcm to $10^{12}$ Ωcm, and electrostatic chucks of the Coulomb type whose characteristic resistance is even larger. Each electrostatic chuck method has its own characteristics but the present embodiment is effective for either method. The present embodiment is described for the case where applied to a CD-SEM having a Coulomb type electrostatic chuck whose material is $Al_2O_3$ which is ideal for CD-SEM where the voltage potential during measurement is critical, and whose wafer voltage potential stability is excellent since the leak current in the present embodiment is essentially zero.

Figure 7:
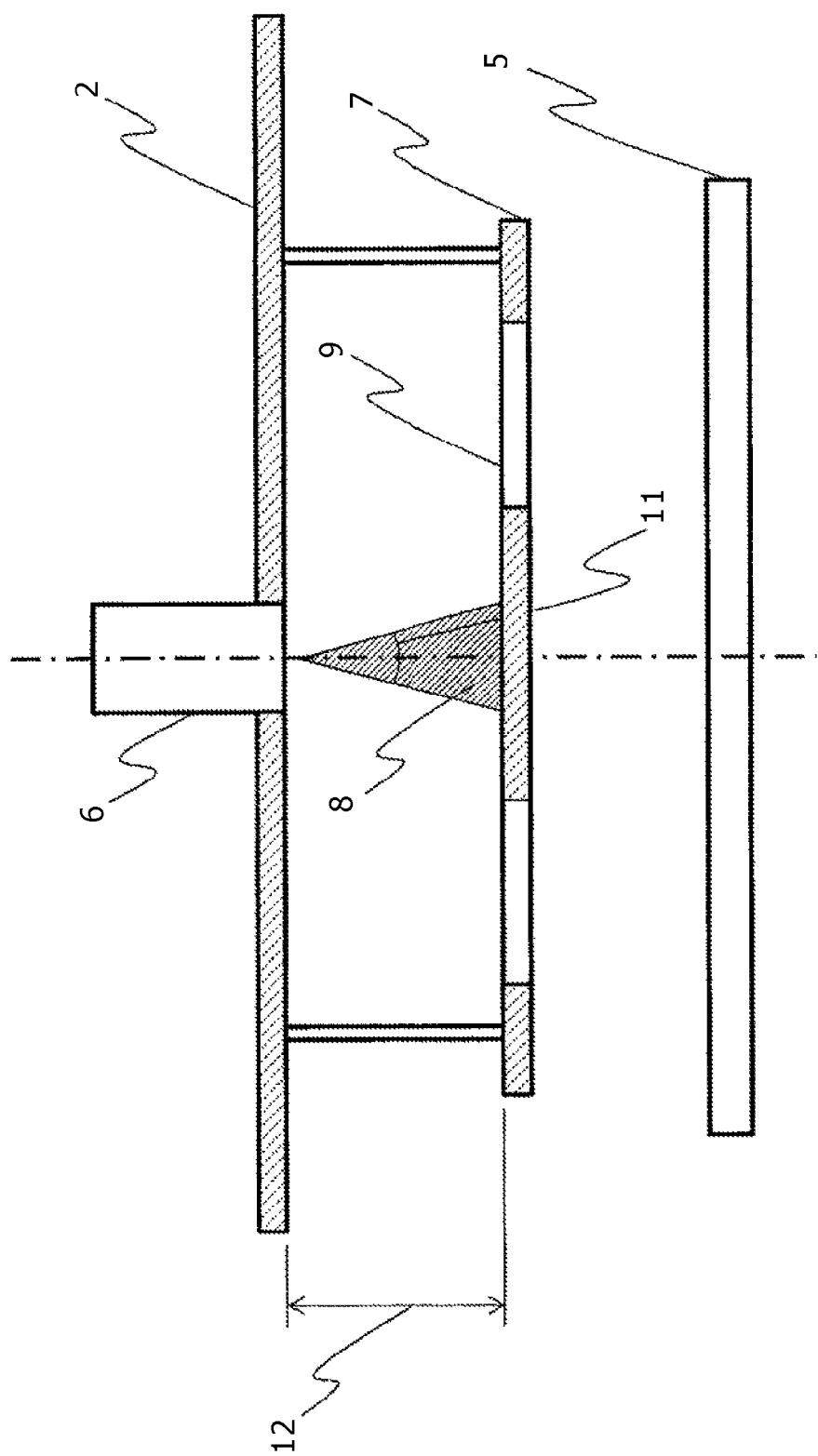
FIG. 7 is a drawing showing one example of the anti-static mechanism containing a shielding member that blocks the direct irradiation of ultraviolet light to the electrostatic chuck.

The optical axis of the ultraviolet light source 6 above the electrostatic chuck is placed concentrically with the electrostatic chuck. The wavelength of the ultraviolet rays irradiated from the ultraviolet light source is 400 nm or less. When the material is irradiated by light at a wavelength having energy larger than the characteristic work function of the substance, a photoelectric effect occurs that causes the emission of electrons, however the work function of $Al_2O_3$ is equivalent to a wavelength of 140 nm so that when light at a wavelength shorter than 140 nm irradiates on the $Al_2O_3$, a photoelectric effect occurs and the electrical charges on the insulating material $Al_2O_3$ are positive. A feature of the present embodiment is that a shielding plate 7 is mounted between the electrostatic chuck 5 and the ultraviolet light source 6 so that only the disassociated residual gas arrives efficiently at the electrostatic chuck without the ultraviolet rays directly arriving at the electrostatic chuck, and the residual electrical charges can be removed while preventing positive charges from the photoelectric effect. FIG. 7 is a drawing showing the features of the present embodiment in detail. The electrostatic chuck 5, the ultraviolet light source 6, and the shielding plate 7 are all placed along the same axis, and ultraviolet rays from the ultraviolet light source 6 irradiate to a region of the aperture angle α (dimension 11 in the figure). Moreover, along with installing the shielding plate 7 perpendicularly relative to the adsorption surface (upper surface) of the electrostatic chuck 5, the ultraviolet light is irradiated in a state where the center portion of the shielding plate 7 receiving the ultraviolet light is mounted in a state concentric to the center of the adsorption surface of the electrostatic chuck 5. Also, the adsorption surfaces of the irradiated section and electrostatic chuck 75 are separated by equidistant gaps so that the gas emitted by the irradiated section gradually disperses and arrives at the adsorption surface so that uniform charge removal can be achieved.

Figure 8:
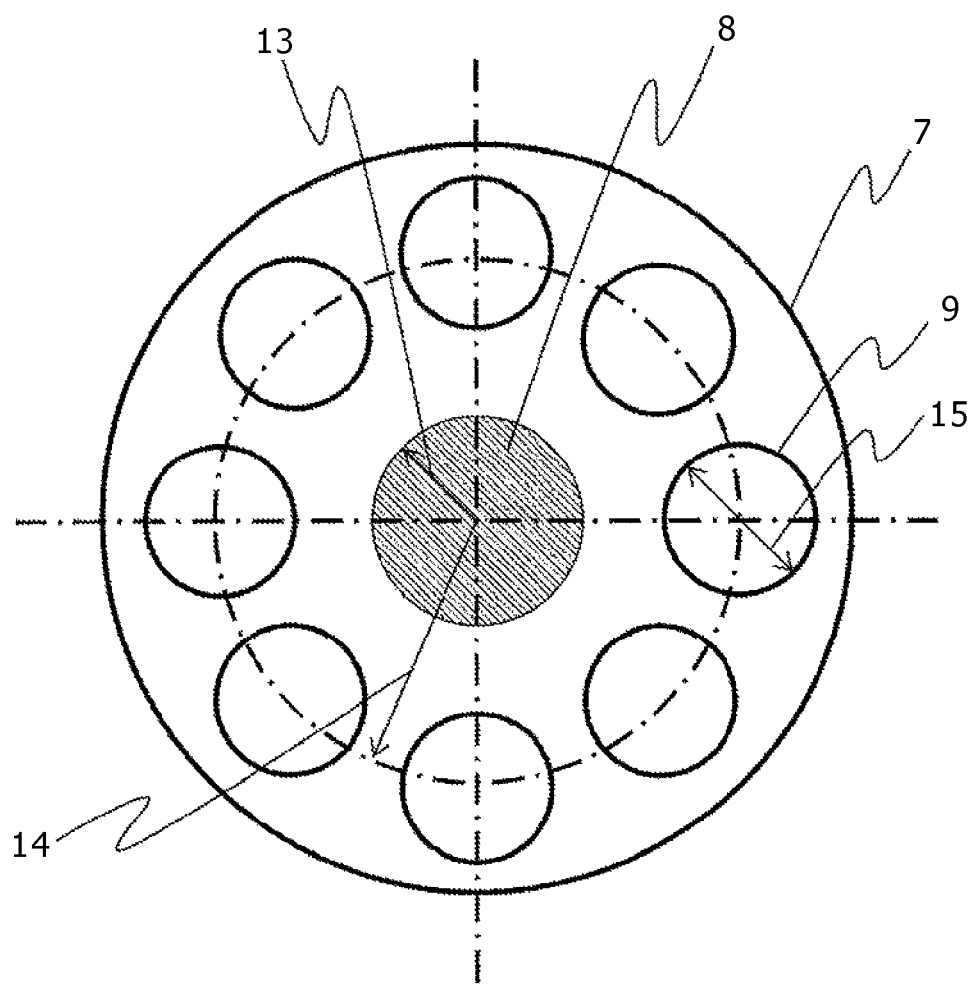
FIG. 8 is a drawing showing one example of a shielding member that blocks the direct irradiation of ultraviolet light to the electrostatic chuck.

The shielding plate 7 is mounted at a position separated only by a distance l (dimension 12 in the figure) from the ultraviolet light source 6, and a through hole 9 is formed at a position not overlapping the ultraviolet ray emission region 8. FIG. 8 is a drawing showing the shielding plate 7 from the ultraviolet light source 6 side. In the present embodiment, circular holes are formed as through holes at eight (axially symmetric) locations at uniform spacing along the same radius from the center of the shielding plate 7. The ultraviolet ray emission region 8 (irradiated section) over the shielding plate 7 is a range at or below the value r (dimension 13 in the figure) shown in formula 1 from the center of the shielding plate.

$$r = \left| \tan \frac{\alpha}{2} \right|$$ (Formula 1)

The through holes 9 are placed so as to maintain the relation shown in Formula 2 at a distance R from the center of the shielding plate (dimension 14 in the figure) and a through hole diameter D (dimension 15 in the figure) so that the ultraviolet ray emission region 8 and the through holes 9 do not overlap.

$$R - \frac{D}{2} > r$$ (Formula 2)

Figure 9:
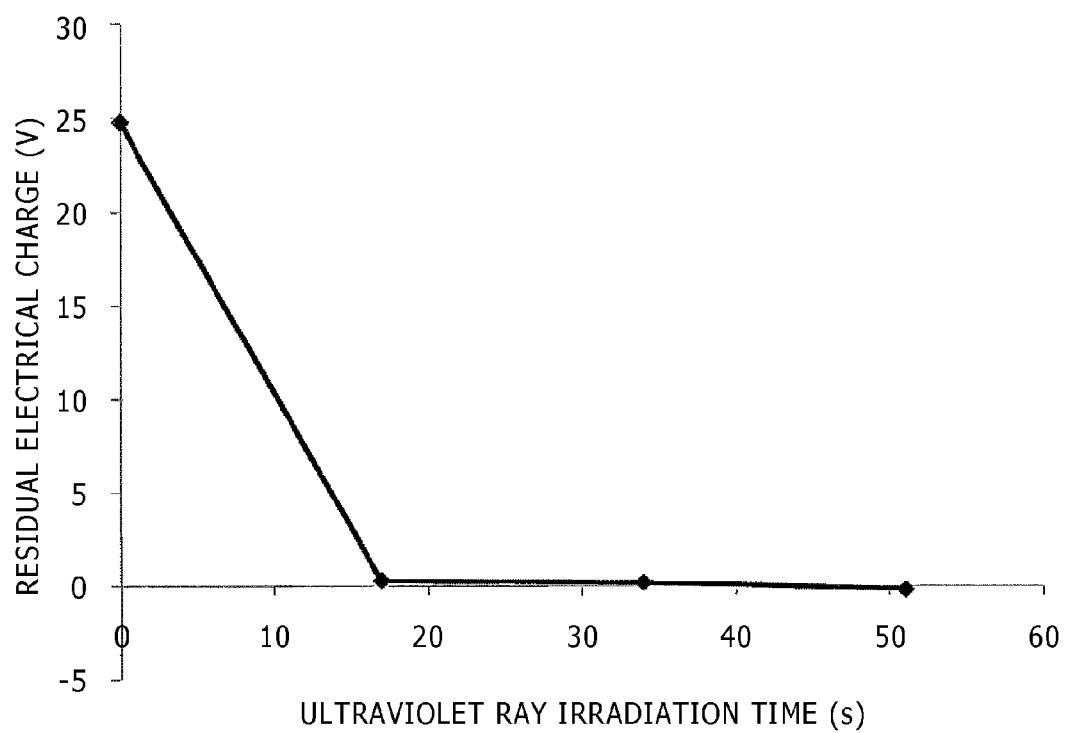
FIG. 9 is a drawing showing the electrical charge removal effect when ultraviolet light is irradiated onto the shielding member from the ultraviolet light source.

In the above type of structure, ultraviolet rays emitted from the ultraviolet light source 6 are not irradiated directly at the electrostatic chuck 5 due to being blocked by the shielding plate 7, and further the residual gas ions and electrons generated within the ultraviolet ray emission region 8 pass through the through holes 9 by way of an electrical field produced by residual electrical charges accumulated over the electrostatic chuck 5 or dispersion and reach the surface of the electrostatic chuck 5 and neutralize the residual electrical charges. FIG. 9 shows one example of results from measuring the time required for removing residual electrical charges accumulated on the electrostatic chuck in a CD-SEM utilizing the present embodiment. The above structure is capable of promptly completing the removal of electrical charges the same as when directly irradiating ultraviolet rays, and further there is no direct irradiation so that no positive charges are emitted during continued irradiation and the level is completely zero.

Figure 10:
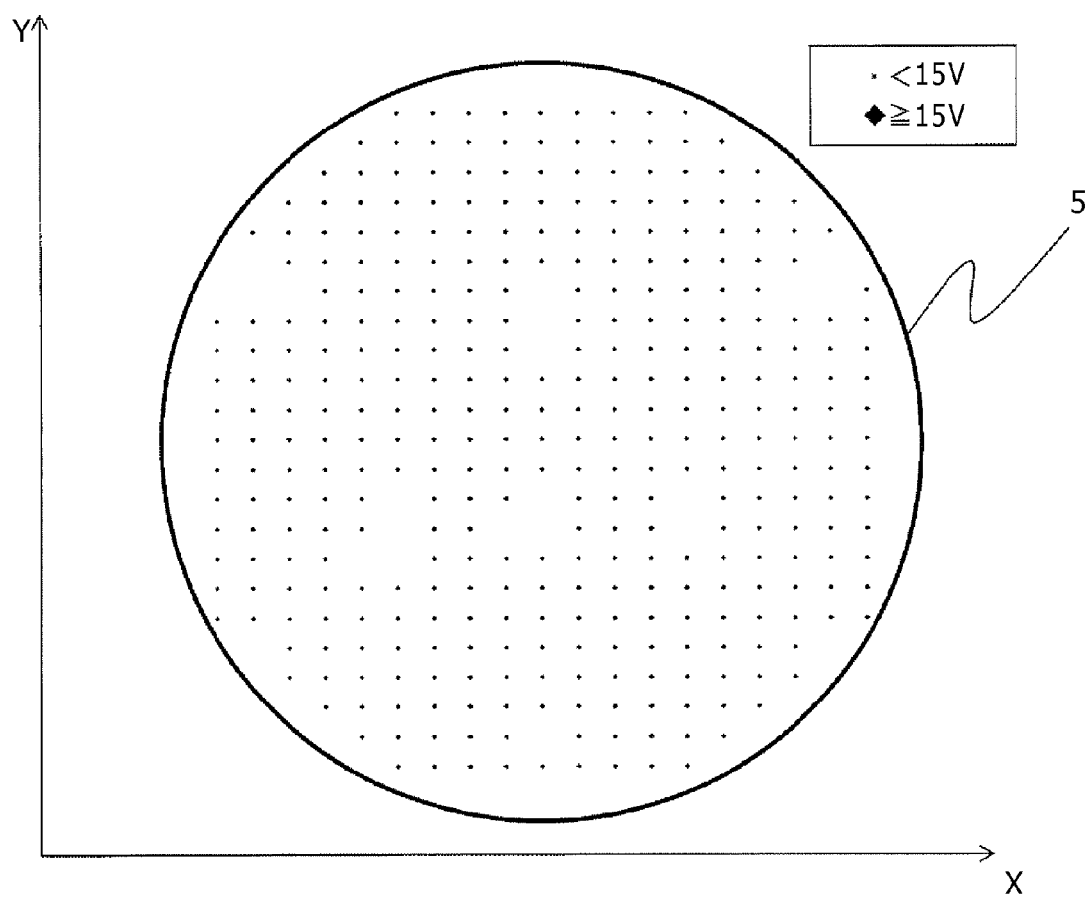
FIG. 10 is a drawing showing the electrical charge distribution on the electrostatic chuck when ultraviolet light is irradiated from the ultraviolet light source onto the shielding member.

FIG. 10 shows one example of results from measuring the electrical charge distribution on the electrostatic chuck after the removal of electrical charges when implementing the present embodiment. The electrostatic chuck and ultraviolet light source are placed concentrically so the spatial symmetry is maintained and there is no non-uniform charge removal. The present embodiment can therefore thoroughly and uniformly removing residual electrical charges accumulated on the electrostatic chuck in a short time.

Figure 11:
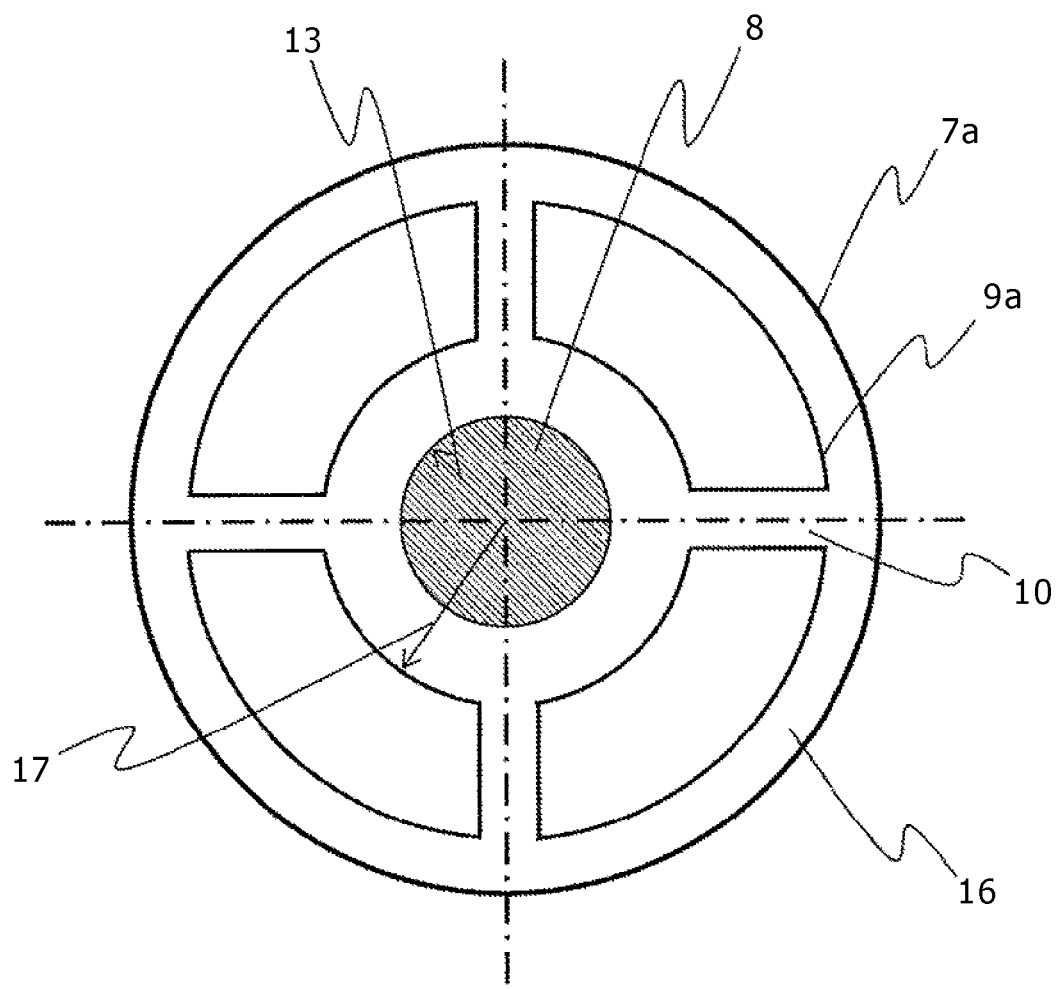
FIG. 11 is a drawing showing one example of the shielding member that blocks the direct irradiation of ultraviolet light to the electrostatic chuck.

The second embodiment is described next. The second embodiment utilizes a shielding plate 7a shown in FIG. 11 instead of the shielding plate 7 shown in FIG. 8. The shielding plate 7a is mounted at a position identical to the shielding plate 7. The through holes 9a are formed at four locations in the shielding plate 7a so as not to overlap the ultraviolet ray emission region 8 with a plus sign-shaped crossbeam 10 and the outer circumferential ring 16 remaining. The diameter R' on the inner side of the through hole 9a (dimension 15 in the figure) is maintained in the relation shown in Formula 3, and the ultraviolet rays emitted from the ultraviolet light source 6 are blocked by the shielding plate 7a.

$$R' > r$$ (Formula 3)

The residual gas ions and electrons generated by the ultraviolet ray irradiation on the other hand can transit through the through holes 9a. Consequently, in the present embodiment, just the dissociated residual gas can reach over the electrostatic chuck without directly irradiating ultraviolet rays to the electrostatic chuck.

A feature of the above structure is that only the dissociated residual gas can uniformly reach over the electrostatic chuck without directly irradiating ultraviolet rays to the electrostatic chuck, so that the electrostatic chuck and ultraviolet light source are not limited to a concentric placement. The same effect can be anticipated even when for example using an arrangement where ultraviolet rays can be irradiated from a side surface direction of the electrostatic chuck, pass uniformly through the space over the electrostatic chuck, and also a sealing plate is mounted so that there is no direct irradiation of ultraviolet rays to the electrostatic chuck.

If using an arrangement where the electrostatic chuck center and shield member center are aligned with each other, an inner surface uniformity of charge suppression effect can be maintained with a comparatively simple structure.

Figure 12:
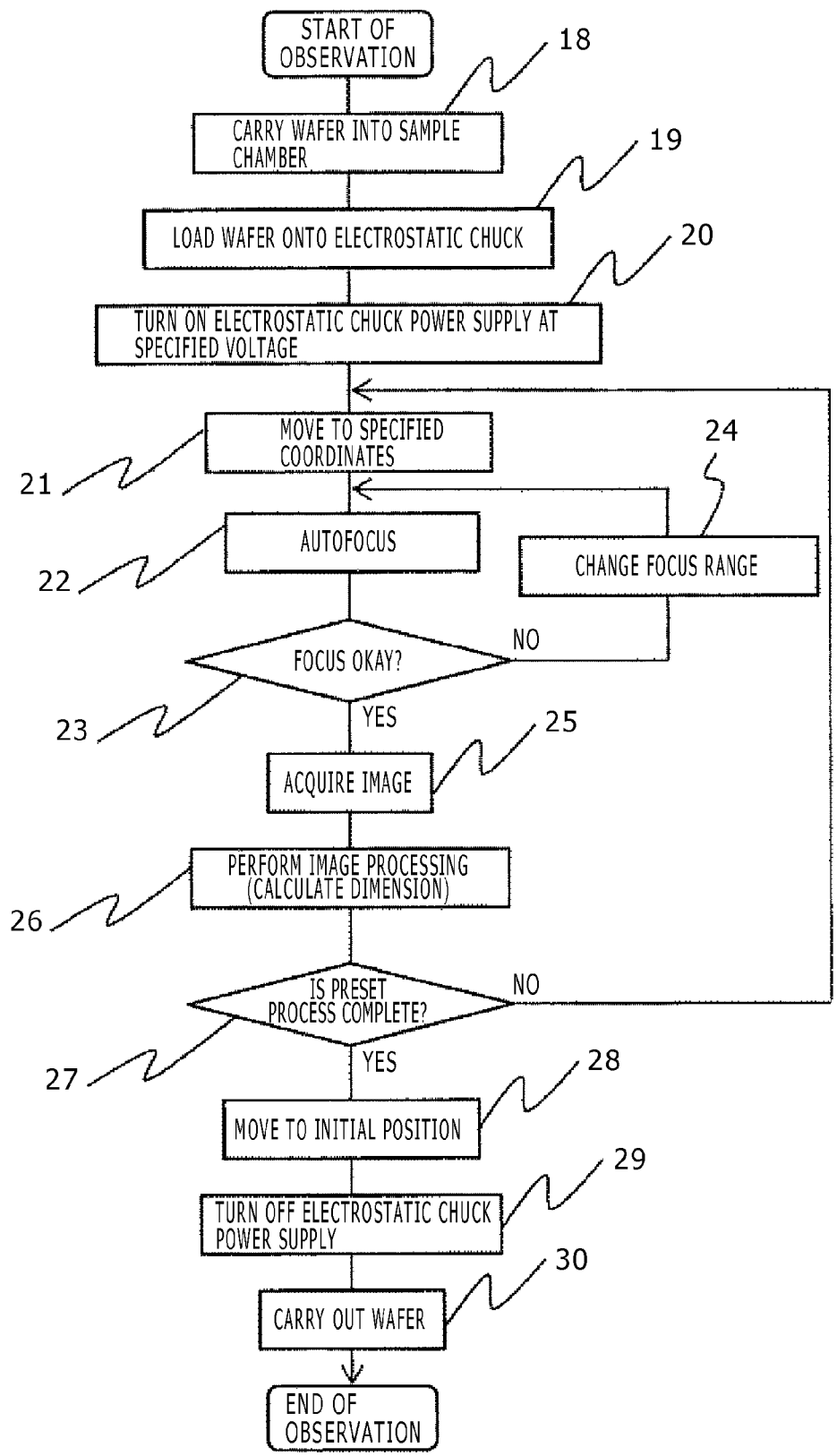
FIG. 12 is a flowchart showing the measurement process utilizing the electron microscope not including an electrical charge removal process.
Figure 13:
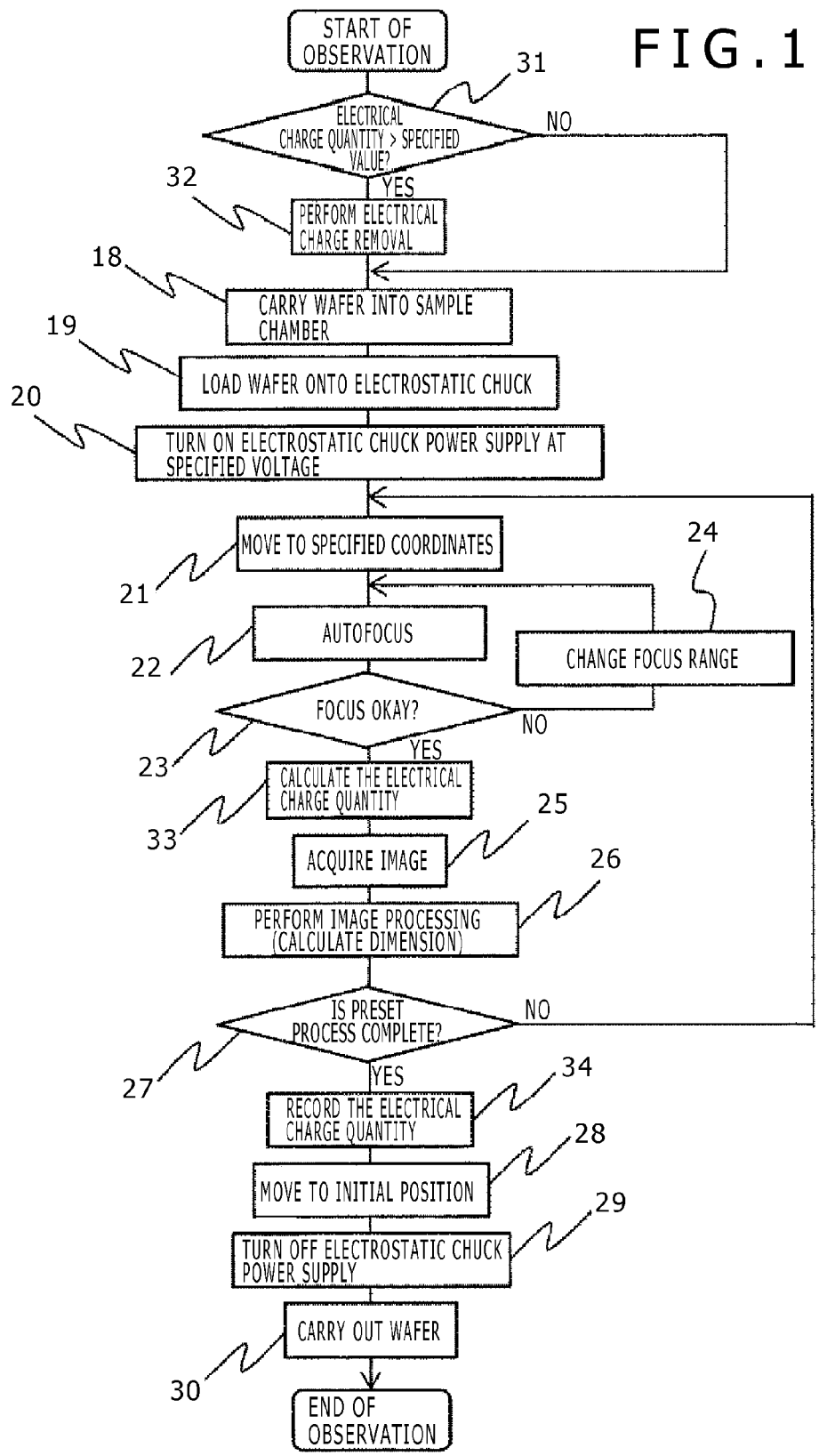
FIG. 13 is a flowchart showing the measurement process utilizing the electron microscope including an electrical charge removal process.

The measurement sequence of the CD-SEM of the present embodiment is described next. FIG. 12 illustrates one example of a flow chart showing a measurement process not including an electrical charge removal process for the electrostatic chuck. FIG. 13 is an example of a flowchart showing the measurement process including an electrical charge removal process for the electrostatic chuck.

A description of the measurement flow chart in FIG. 12 is first of all described. A conveyor mechanism not shown in the drawing carries in the wafer (18), and transfers the wafer onto the electrostatic chuck (19). The electrostatic chuck power source next applies a voltage (20) to statically adsorb the wafer. The X-Y stage is next operated so that the chip for measurement over the wafer moves to the designated coordinate position so as to reach the electron beam irradiation position (21). After movement to the specified position is complete, autofocus is performed and the image focus aligned (22), the electron scans to acquire the image (25), the image is processed based on the acquired image and the target dimensions are calculated (26). When the preset process is complete (27), the wafer is moved to the initial position along with the electrostatic chuck by the X-Y stage. If performing measurement of the next chip and image acquisition without completing the process, the X-Y stage moves again to the specified coordinates of the next chip and repeats the measurement (27). The electrostatic chuck now at the initial position, is stopped by turning off the supply of power from the direct current power source (29), and the wafer is carried out of the device (30). When there are plural wafers for observation, this sequence of actions is sequentially repeated for the plural wafers but the repetitive contact and friction between the electrostatic chuck and wafer causes residual electrical charges to accumulate on the electrostatic chuck surface so that the surface voltage potential of the wafer gradually changes. When the surface voltage potential on the wafer fluctuates, an accompanying fluctuation also occurs in the focus value during autofocus and when this fluctuation in the surface voltage potential is larger than a specified value, the autofocusing can no longer follow up and the focus alignment fails. When the focusing fails, the autofocusing is then re-performed (23) by changing the range of the focus also changes (24), but the time required for measurement increases by that amount, and the device throughput deteriorates.

The measurement flowchart in FIG. 13 is described next. A feature of the operation in this flow chart is that prior to carry-in of the target wafer for observation into the device, the electrical charge quantity on the electrostatic chuck is known beforehand from the observation information from the previous loaded wafer more than the target wafer, and charge removal implemented by ultraviolet rays prior to carry-in of the target wafer if the electrical charge quantity is larger than a specified value. The electrical charge quantity of the electrostatic chuck is recorded onto a memory (recording medium) within the control device described later on and before carry-in of the wafer judgment is made whether the electrical charge quantity is larger than a specified value. If the electrical charge quantity is larger than the specified value (31), charge removal is performed by ultraviolet ray irradiation (32), and if the electrical charge quantity is smaller than a specified value (31), then the wafer is carried in with no charge removal (18). The specified value serving as the judgment criteria is a value to an extent not resulting in autofocus failure and not causing deterioration in conveying accuracy, and no increase of adhering foreign matter, or in other words is set to a value where the device is capable of operating safely. The electrical charge quantity of the electrostatic chuck is calculated from the focus change quantity (33) for each measurement location within the wafer surface during autofocus, and that average value is recorded in the recording medium (34). This value is renewed for each wafer and a judgment made whether or not the target wafer for observation requires electrical charge removal before carry-in based on the electrical charge quantity measured for the just previous wafer (31). By utilizing this type of flow chart, the electrical charges on the electrical chuck can be automatically removed before any problems with equipment operation occur due to the residual electrical charges accumulated on the electrostatic chuck so that a CD-SEM capable of stable, continuous operation can be provided without a drop in the device throughput. The present embodiment disclosed an example where ultraviolet rays are irradiated prior to carry-in of the new wafer for measurement however the voltage potential of the wafer may be measured during the measurement and ultraviolet rays irradiated immediately after carry-out of the wafer. Moreover, directly irradiating ultraviolet rays onto the wafer might cause damage, so that needless to say, a safety circuit can be built in to prevent direct irradiation of ultraviolet rays during wafer carry-in.

The above sequence described a method for calculating the electrical charge quantity on the electrostatic chuck from the change quantity in the autofocus however the electrical charge on the electrostatic chuck surface may be directly measured by using a voltage potential measurement method such as a surface electrometer and based on those results a judgment made on whether charge removal is required or not.

The present embodiment configured as described above where an electrostatic chuck is utilized in an electron microscope, is capable of providing a scanning electron microscope for uniformly and reliably removing residual electrical charges that accumulate on the electrostatic chuck during operation of the device, and further providing continuous stable performance while the drop in the device operation rate is suppressed to minimum.

Figure 14:
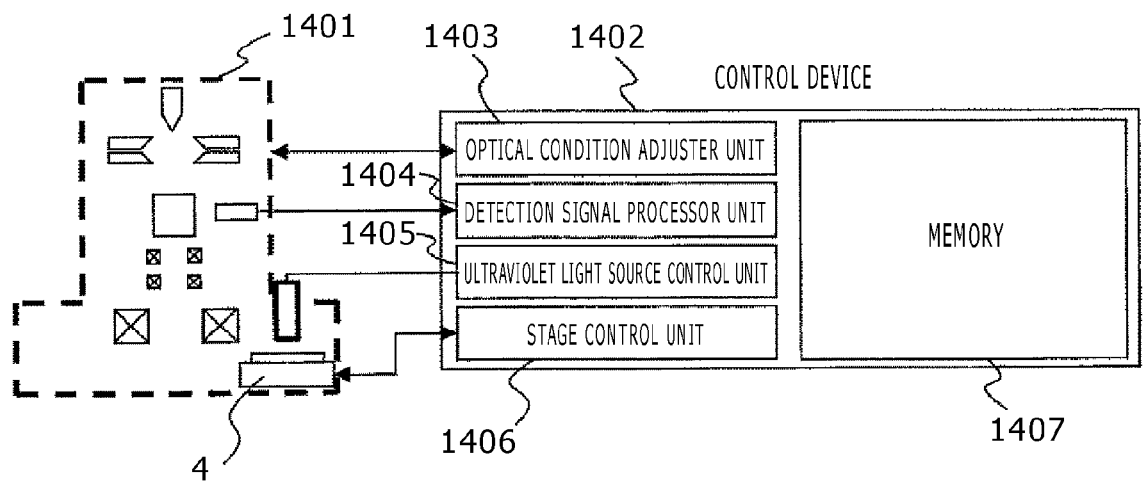
FIG. 14 is a drawing showing an example of a scanning electron microscope system.

FIG. 14 is a drawing showing an example of a scanning electron microscope system configured from a scanning electron microscope unit 1401, and a control device 1402 that controls the scanning electron microscope. The control device 1402 contains an optical condition adjuster unit 1403 that controls the optical conditions in the scanning electron microscope unit 1401, and a detection signal processor unit 1404 to perform measurement and inspections based on image signal along with performing image forming and profile waveform forming based on the detected electrons. Also an ultraviolet light source control unit 1405 to control the ultraviolet light source that performs charge removal on the electrostatic chuck not shown in the drawing, a stage control unit 1406 to control the on and off of the power source for the electrostatic chuck along with controlling the sample stage, and a memory 1407 to pre-store control conditions for the control device.

Figure 15:
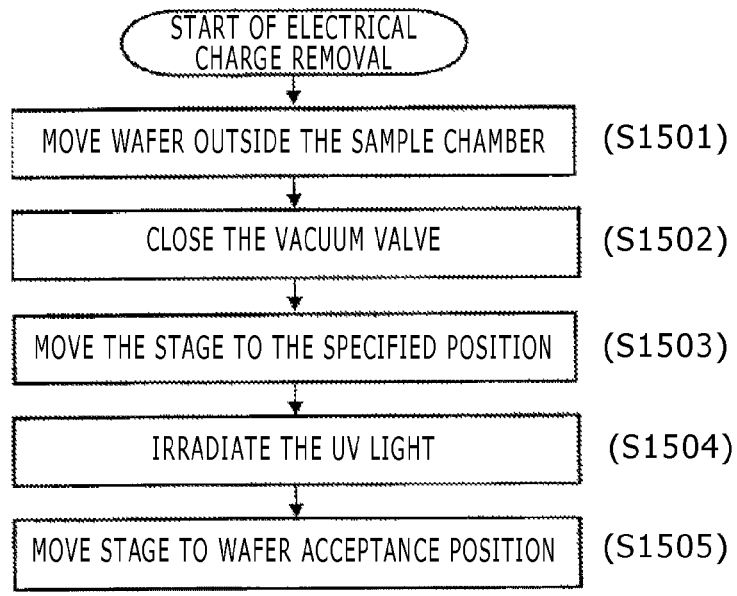
FIG. 15 is a flow chart showing the electrical charge removal process.
Figure 16:
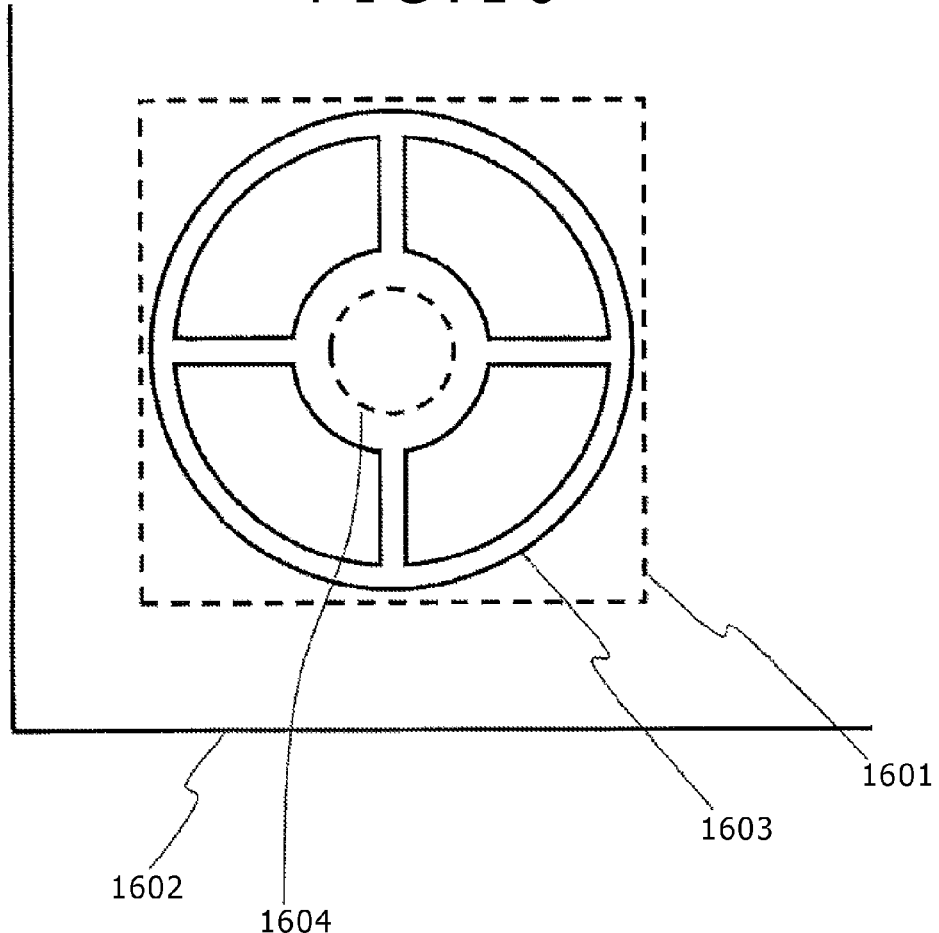
FIG. 16 is a drawing showing the positional relationship between the shielding member and the electrical charge removal position set within the sample chamber.

The scanning electron microscope system configured as described above performs electrical charge removal on the electrostatic chuck based on a flow chart such as shown in the example in FIG. 15. First of all, when a wafer is remaining in the sample chamber, the wafer is conveyed out of the sample chamber (step 1501), and the vacuum valve mounted between the sample chamber and auxiliary exhaust chamber is closed (step 1502). Next, the sample stage 4 where the electrostatic chuck is loaded is moved to a location to perform electrical charge removal (step 1503). The location to perform electrical charge removal is for example an electrostatic chuck charge removal position 1601 as illustrated in FIG. 16. FIG. 16 is a drawing showing an example of the positional relationship between the shielding member 1603 mounted in the sample chamber 1602 and the electrostatic chuck charge removal position 1601, and is a view as seen from above the sample chamber 1602. After the electrostatic chuck is moved to the electrostatic chuck charge removal position 1601, an ultraviolet light source not shown in the drawing irradiates ultraviolet rays in the ultraviolet ray emission region 1604 over the shielding member 1603 (step 1504), and removes the electrical charges by generating dissociated residual gas. After the electrical charge removal ends, the stage is moved to the wafer acceptance position in front of the vacuum valve for restoring to the normal measurement and inspection processes (step 1505).

The ultraviolet ray emission region 1604 is set smaller than the shield section of the shielding member 1603 so that direct irradiation of ultraviolet rays onto the electrostatic chuck can be avoided, and dissociated residual gas can selectively reach the electrostatic chuck.

Figure 17:
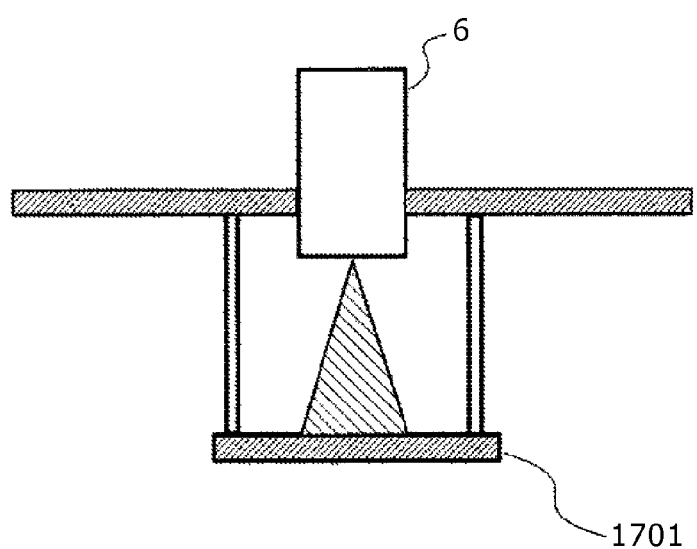
FIG. 17 is a drawing showing an example of the anti-static mechanism containing a shielding member that blocks the direct irradiation of ultraviolet light to the electrostatic chuck.

FIG. 17 is a drawing showing another mounting example of the shielding member 1701 below the ultraviolet light source 6 (electrostatic chuck side (direction aligned with gravitational field)). In the example in FIG. 17, the shielding member 1701 is a comparatively simple structure compared to the other examples. This arrangement can suppress the direct irradiation of ultraviolet light by way of a relatively simple structure and selectively allows the dissociated residual gas to reach the electrostatic chuck however there is no outer frame such as for the shielding plate 7 in FIG. 7 so that the shielding plate illustrated in FIG. 7 possesses a structure better suited for selectively allowing the residual gas to reach the region where the electrostatic chuck is located.

Figure 18:
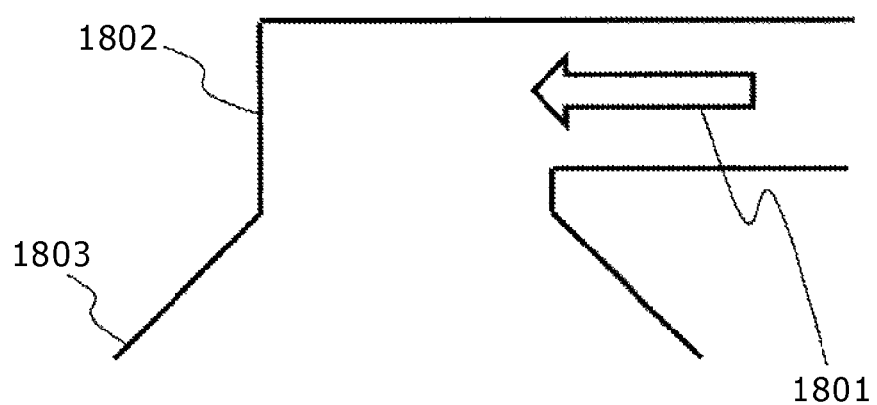
FIG. 18 is a drawing showing an example of the anti-static mechanism containing a shielding member that blocks the direct irradiation of ultraviolet light to the electrostatic chuck.

FIG. 18 is a drawing showing a further another example for generating dissociated residual gas without directly irradiating ultraviolet light onto the electrostatic chuck. The ultraviolet light 1801 is irradiated from the side of the sample chamber to the irradiated ultraviolet light section 1802. The dissociated residual gas generated at the irradiated ultraviolet light section 1802 is supplied to the electrostatic chuck positioned downwards from the gas supply port 1803. Even this type of structure is capable of suppressing the direct irradiation of ultraviolet light by way of a relatively simple structure and selectively allowing the dissociated residual gas to reach the electrostatic chuck. However, from the point of view of a uniform charge removal effect, a state where the optical axis of the ultraviolet light, the center position of the shielding member, and the center position of the electrostatic chuck are positioned concentrically as illustrated in FIG. 7 is preferable for performing ultraviolet light irradiation.

LIST OF REFERENCE SIGNS

1 Lens tube
2 Sample chamber
3 Auxiliary exhaust chamber
4 X-Y stage
5 Electrostatic chuck
6 Ultraviolet light source
7 Shielding plate
8 Ultraviolet ray emission region

The invention claimed is:

1. A charged particle beam apparatus comprising:
a charged particle source;
an electrostatic chuck that holds a sample to be irradiated by a charged particle beam emitted from the charged particle source; and
a sample chamber that maintains a space containing the electrostatic chuck in a vacuum state,
wherein the charged particle beam apparatus further includes an ultraviolet light source to irradiate ultraviolet light within the sample chamber, after unloading the sample from the electrostatic chuck, prior to loading another sample to the electrostatic chuck, and an irradiation target member irradiated by the ultraviolet light, the irradiation target member being spaced from an adsorption surface of the electrostatic chuck in a direction perpendicular to the adsorption surface of the electrostatic chuck;
wherein the ultraviolet light source and the irradiation target member are disposed so as to irradiate the ultraviolet light to the irradiation target member without irradiating the ultraviolet light to the absorption surface of the electrostatic chuck.

2. The charged particle beam apparatus according to claim 1, further comprising:
a sample stage that holds electrostatic chuck; and
a control device that controls the sample stage and the ultraviolet light source,
wherein the control device controls the ultraviolet light source so as to irradiate the ultraviolet light when the electrostatic chuck is mounted at a position below the irradiation target member.

3. The charged particle beam apparatus according to claim 1,
wherein the irradiation target member includes an irradiation target section irradiated by the ultraviolet light, and a plurality of axially symmetrical apertures centered on the irradiation target section.

4. The charged particle beam apparatus according to claim 3,
wherein the irradiation target section includes an irradiation target surface larger than an irradiation range of the ultraviolet light.

5. The charged particle beam apparatus according to claim 1, further comprising:
a control device that measures electrical charge accumulated on the electrostatic chuck,
wherein the control device implements electrical charge removal utilizing the ultraviolet light source when the measured result exceeds a specified value.

\* \* \* \* \*